(12) United States Patent
Nielsen et al.

(10) Patent No.: US 12,280,713 B1
(45) Date of Patent: Apr. 22, 2025

(54) OVERHEAD CEILING LIGHTS FOR VEHICLES

(71) Applicants: Christian Nielsen, Palm Coast, FL (US); Jakub Gregor, Palm Coast, FL (US); Martin Suvak, Kosice (SK); Daniel Stenko, Kosice (SK)

(72) Inventors: Christian Nielsen, Palm Coast, FL (US); Jakub Gregor, Palm Coast, FL (US); Martin Suvak, Kosice (SK); Daniel Stenko, Kosice (SK)

( * ) Notice: Subject to any disclaimer, the term of this patent is extended or adjusted under 35 U.S.C. 154(b) by 0 days.

(21) Appl. No.: 18/937,510

(22) Filed: Nov. 5, 2024

(51) Int. Cl.
| | | |
|---|---|---|
| *B60Q 3/20* | (2017.01) | |
| *B60Q 3/44* | (2017.01) | |
| *B60Q 3/74* | (2017.01) | |
| *B60Q 3/76* | (2017.01) | |
| *B60Q 3/82* | (2017.01) | |
| *F21V 23/04* | (2006.01) | |

(52) U.S. Cl.
CPC ............... *B60Q 3/20* (2017.02); *B60Q 3/74* (2017.02); *B60Q 3/82* (2017.02); *B60Q 3/44* (2017.02); *B60Q 3/76* (2017.02); *F21V 23/04* (2013.01); *F21V 23/0485* (2013.01); *H03K 2217/96042* (2013.01); *H03K 2217/9653* (2013.01)

(58) Field of Classification Search
CPC .... B60Q 3/44; B60Q 3/76; B60Q 3/82; F21V 23/04; F21V 23/0485; H03K 2217/96042; H03K 2217/9653
See application file for complete search history.

(56) References Cited

U.S. PATENT DOCUMENTS

| 7,192,167 B1 * | 3/2007 | Kuo | B60Q 3/76 362/362 |
|---|---|---|---|
| 2005/0174791 A1 * | 8/2005 | Bynum | B60Q 3/82 362/490 |
| 2009/0116255 A1 * | 5/2009 | Kearns | B60Q 3/51 362/490 |
| 2020/0103100 A1 * | 4/2020 | Hibino | F21V 21/30 |
| 2021/0364142 A1 * | 11/2021 | Zheng | F21V 3/049 |

FOREIGN PATENT DOCUMENTS

KR 200450229 Y1 * 9/2010

OTHER PUBLICATIONS

Machine translation of KR 200450229 Y1 retrieved from the FIT database of PE2E search. (Year: 2024).*

* cited by examiner

*Primary Examiner* — Colin J Cattanach
(74) *Attorney, Agent, or Firm* — Barry Choobin; Patent 360

(57) ABSTRACT

An overhead ceiling device for vehicles, such as airplanes. The device includes a faceplate, keypad, PCB, body, light module, and an outer mounting compression ring body. The faceplate includes lens for lights and holes for buttons. Keypad includes buttons that can protrude from the holes in the faceplate. The keypad is seated over the PCB, wherein the PCB includes indicator lights and key input modules for the buttons. The PCB is seated over the flanged plate of the body. The faceplate, keypad, PCB and the body have a central hole for receiving the light module. The light module includes a reading light.

6 Claims, 4 Drawing Sheets

OVERHEAD CEILING LIGHTS FOR VEHICLES

CROSS-REFERENCE TO RELATED APPLICATIONS

Field of Invention

The present invention relates to multipurpose overhead ceiling lights for vehicles, and more particularly, the present invention relates to multipurpose lights for use as reading lights and indicator lights in vehicles/aircraft.

Background

Various types of lights are provided in a passenger cabin of any transportation system, such as reading lights and indicator lights. Examples of such transportation systems include helicopters, airplanes, buses, and the like. These lights are generally mounted on the ceiling above a passenger seat or the bulkhead wall beside a passenger. The positions of lights and indicators are such that these are readily accessible to a passenger sitting on a passenger seat. For example, in a domestic aircraft, overhead ceiling lights and indicator buttons are common above the passenger seat. Indicator lights can be for indicating a notification, such as no smoking, seat belt status, and the like. Similar lights are provided in buses, cars, taxis, and the like. Such lights may also be referred to as dome lights, interior lights, or courtesy lights.

The overhead assemblies including the ceiling lights, actionable buttons, and indicator lights, although common in use, have several drawbacks. In particular, the known designs of overhead assemblies are bulky and protrude significantly from the ceiling surface. A person standing up from the seat may accidentally hit their head on the protruding light resulting in a head injury. Also, the installation and repair of overhead assemblies is complex. The higher power consumption and the combined weight of multiple individual LED lights, actionable buttons, indicator lights, and the like is another drawback.

A need is therefore appreciated for a novel light device that overcomes the above drawbacks with conventional lights.

The term vehicle herein refers to road vehicles, such as cars and buses; aircraft, such as helicopters, drones, and airplanes; and water vehicles, such as boats and ships.

SUMMARY OF THE INVENTION

The following presents a simplified summary of one or more embodiments of the present invention to provide a basic understanding of such embodiments. This summary is not an extensive overview of all contemplated embodiments and is intended to neither identify key or critical elements of all embodiments nor delineate the scope of any or all embodiments. Its sole purpose is to present some concepts of one or more embodiments in a simplified form as a prelude to the more detailed description that is presented later.

The principal object of the present invention is therefore directed to a multipurpose overhead ceiling device for vehicles that does not protrude significantly from the ceiling surface.

Another object of the present invention is that the device may include reading lights, calling buttons, indicator lights, and the like in a compact housing.

Still, another object of the present invention is that the reading light can be flat or slightly tilted to create any "beam cone" desired by the user.

Another object of the present invention is that the multipurpose overhead ceiling light device is compact in construction.

Still another object of the present invention is that the multipurpose overhead ceiling light device is economical to manufacture and can be made from recycled and/or green materials.

Yet another object of the present invention is that the device combines a tiltable reading light along with information signs and action buttons into an integrated lightweight unit.

A further object of the present invention is that multiple lights and indicators can be included for a range of information, actions, and warnings.

Still, a further object of the present invention is that the light beam optics and colors are also fully changeable.

An additional object of the present invention is that the device can be easily installed and removed for repairs.

Still an additional object of the present invention is that the device is low weight and small size.

Yet, an additional object of the present invention is that the device is energy efficient.

BRIEF DESCRIPTION OF DRAWINGS

The accompanying figures, which are incorporated herein, form part of the specification and illustrate embodiments of the present invention. Together with the description, the figures further explain the principles of the present invention and to enable a person skilled in the relevant arts to make and use the invention.

DETAILED DESCRIPTION

Figure 1:
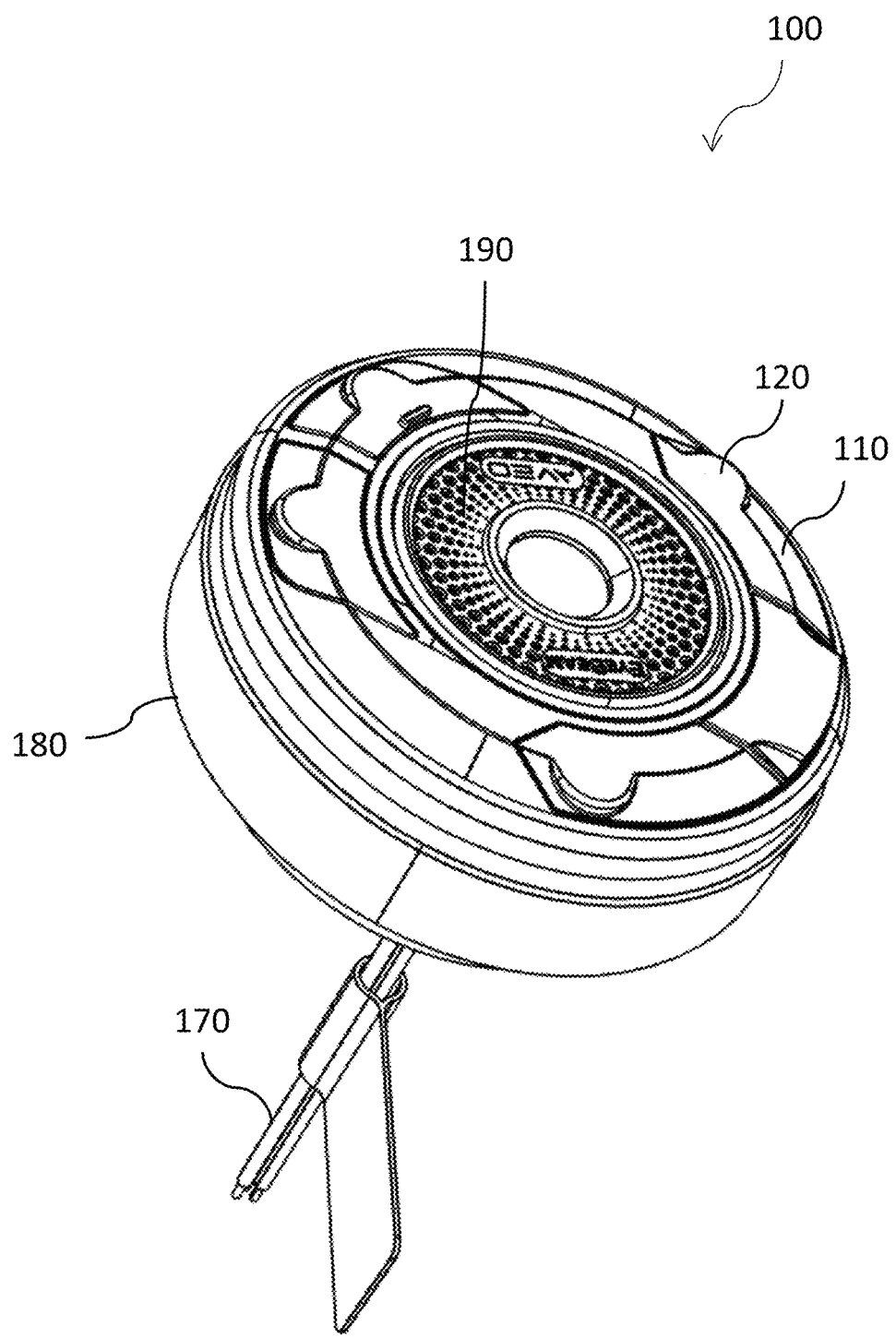
FIG. 1 is a front and side perspective view of a multipurpose overhead ceiling device, according to an exemplary embodiment of the present invention.

Subject matter will now be described more fully hereinafter with reference to the accompanying drawings, which form a part hereof, and which show, by way of illustration, specific exemplary embodiments. Subject matter may, however, be embodied in a variety of different forms and, therefore, covered or claimed subject matter is intended to be construed as not being limited to any exemplary embodiments set forth herein; exemplary embodiments are provided merely to be illustrative. Likewise, a reasonably broad scope for claimed or covered subject matter is intended. Among other things, for example, the subject matter may be embodied as methods, devices, components, or systems. The following detailed description is, therefore, not intended to be taken in a limiting sense.

The word "exemplary" is used herein to mean "serving as an example, instance, or illustration." Any embodiment described herein as "exemplary" is not necessarily to be construed as preferred or advantageous over other embodiments. Likewise, the term "embodiments of the present invention" does not require that all embodiments of the invention include the discussed feature, advantage, or mode of operation.

The terminology used herein is to describe particular embodiments only and is not intended to be limiting to embodiments of the invention. As used herein, the singular forms "a", "an" and "the" are intended to include the plural forms as well, unless the context clearly indicates otherwise. It will be further understood that the terms "comprise", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The following detailed description includes the best currently contemplated mode or modes of carrying out exemplary embodiments of the invention. The description is not to be taken in a limiting sense but is made merely to illustrate the general principles of the invention since the allowed claims of any resulting patent will best define the scope of the invention.

Disclosed is a multipurpose overhead ceiling device for vehicles including cars, buses, airplanes, boats, and the like. The disclosed multipurpose overhead ceiling device can be used in passenger cabins and preferably above the passenger seats. When mounted above a passenger seat in the ceiling, i.e., on an overhead ceiling portion, the disclosed multipurpose overhead ceiling device may provide functionalities of a reading light, calling buttons, actionable buttons, indicator lights, and many other features. The disclosed multipurpose overhead ceiling device integrates different functionalities of lights, buttons, and indicators in one compact unit. The disclosed multipurpose overhead ceiling light device is compact and light in weight, thus when installed appears to be aesthetic and takes significantly less ceiling space. Another crucial feature of the invention is that the disclosed multipurpose overhead ceiling device does not protrude significantly from the ceiling surface. This overcomes the drawbacks of conventional lights that protrude significantly and may hit the passenger in the head when the passenger stands up from the seat. The multipurpose overhead ceiling light device allows adding multiple indicator lights for multiple purposes, such as service light, call light, panic light, and many other features.

Figure 2:
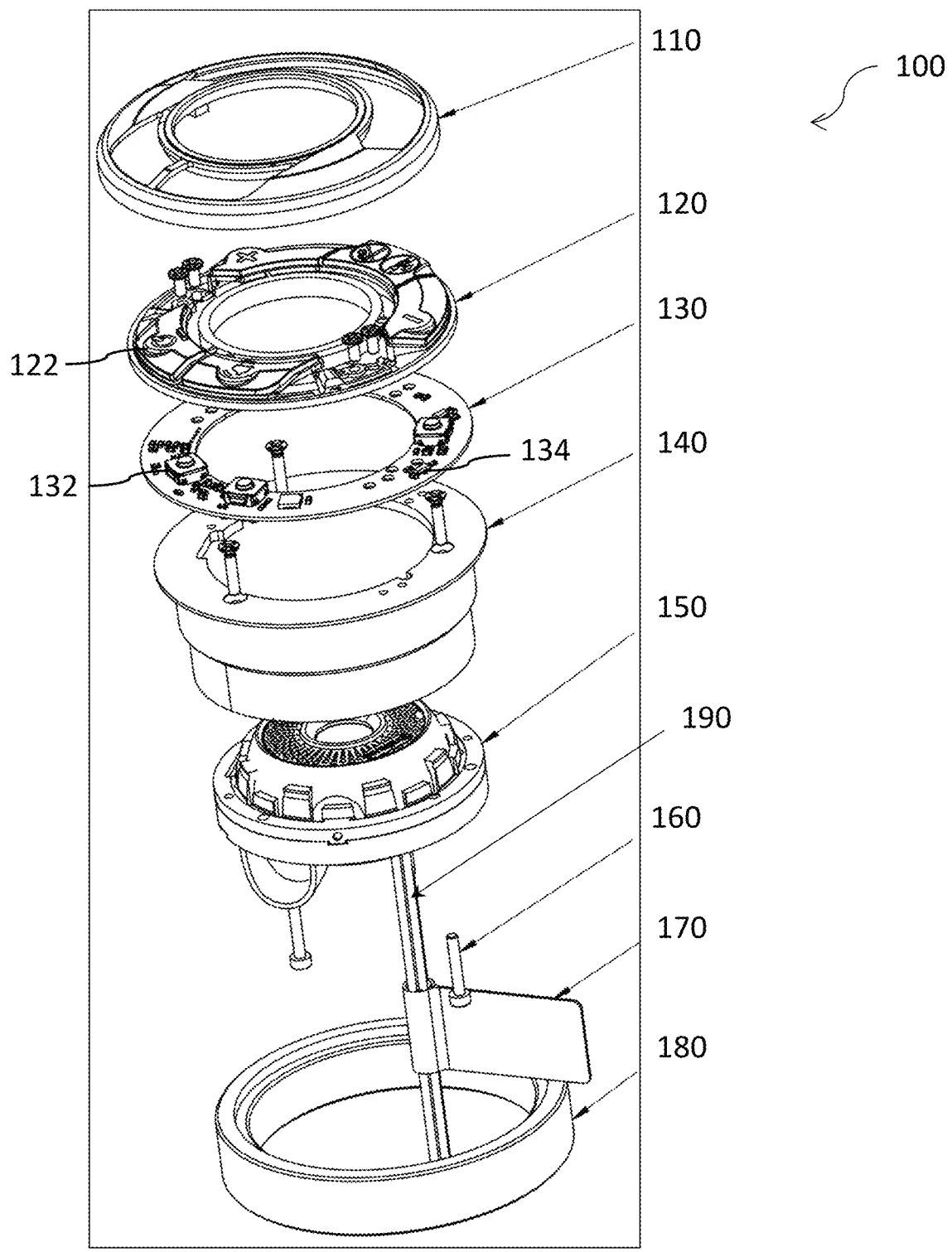
FIG. 2 is an exploded view of the multipurpose overhead ceiling device, according to an exemplary embodiment of the present invention.
Figure 3:
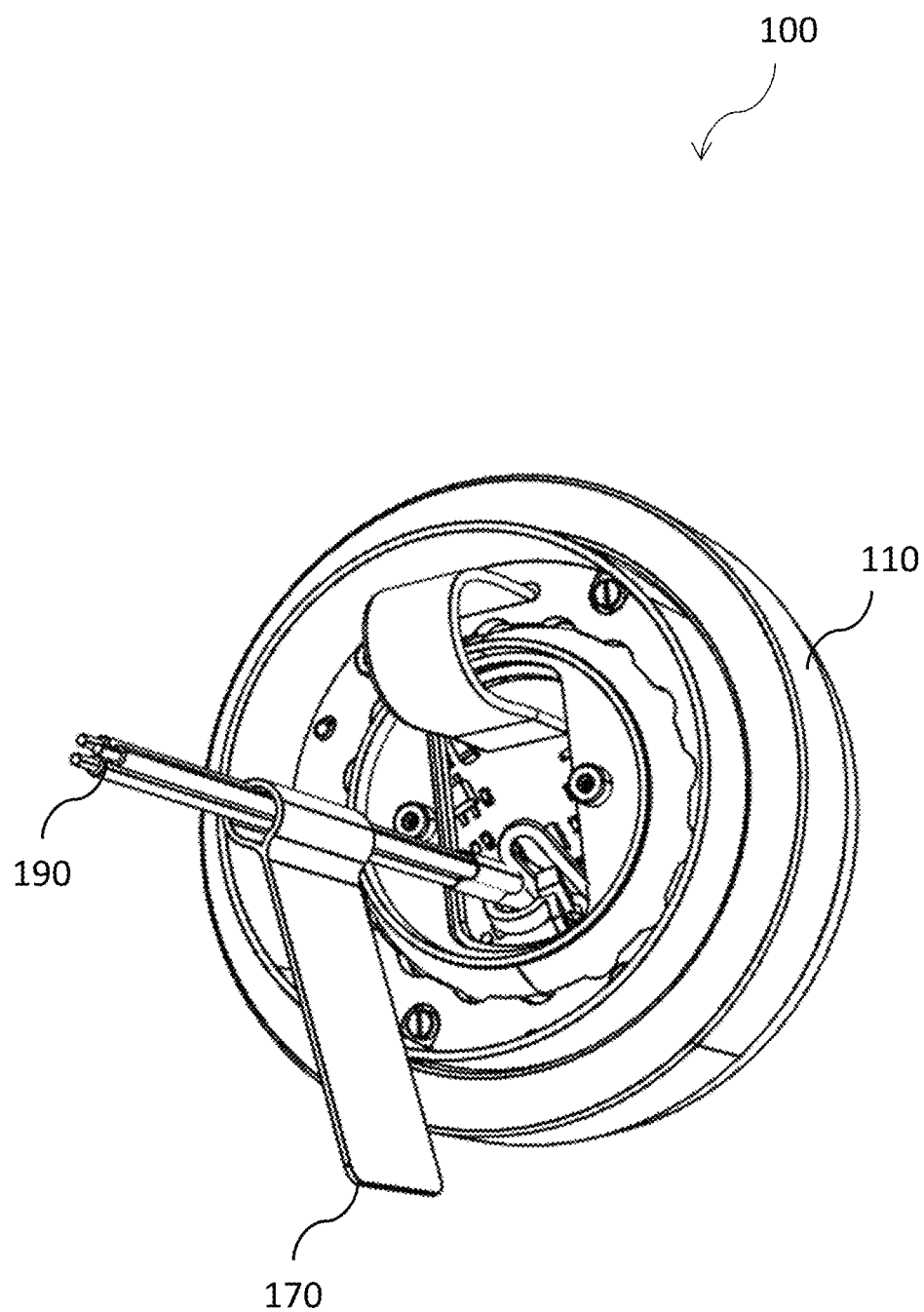
FIG. 3 is a rear and side perspective view of the multipurpose overhead ceiling device, according to an exemplary embodiment of the present invention.

FIG. 1 shows an exemplary embodiment of the present invention, which is a front and side perspective view of the multipurpose overhead ceiling device 100. FIG. 2 shows an exploded view of the multipurpose overhead ceiling device 100, and FIG. 3 shows a rear and side perspective view of the multipurpose overhead ceiling device 100. The multipurpose overhead ceiling device 100 may include a faceplate 110, a keypad 120, a keys PCB board 130, a body 140, a sliding assembly 150, a nut 160, an ID label 170, a compression ring body 180, and wires 190.

The face plate 100 is circular in shape and is hollow in the center. The faceplate includes several lenses for the lights and indicators, the lenses may be disposed spaced apart from each other in any desired arrangement. The faceplate may also include holes through which the buttons may protrude through. The buttons can be used to operate the lights and indicators. A button can be positioned along its associated light or indicator and may be positioned adjacent to the respective lens. A space for the label can also be provided adjacent to the respective button, wherein the label may indicate the nature of the button. For example, the label may include icons for calling, emergency, no smoke, and the like. The labels may be engraved or printed on the faceplate. Also, the labels may be interchangeably adhered on the faceplate. Also, the labels can be printed on the lenses and buttons. For example, a lens can be actuated as a button and the label is placed on the lens itself. When the respective light is lit, the label may be illuminated in a contrasting color. The faceplate may be made from a rigid material, such as plastic and aluminum including 100% recycled materials. Preferably, the faceplate can be made from lightweight material so that the device can be light in weight. The faceplate may flush with the ceiling surface in which the disclosed device is installed. The edges of the faceplate may be rounded to prevent any injury.

The multipurpose overhead ceiling device 100 may also include a keypad 120 positioned below the faceplate. The keypad also includes a central hole similar to the faceplate and can fit into the bottom of the faceplate. The keypad includes the keys/buttons 122 that can protrude through the holes in the faceplate. The respective button can be pressed by a person to turn the associated indicator or light on and off. The labels can be printed on the buttons of the keypad. For example, FIG. 2 shows the buttons having different labels including that of power, notification bell, seat belt, and no-smoking. The keypad also includes holes for the screws, wherein the screws can secure the keypad to the body.

The device 100 further includes a PCB 130, which can be sandwiched between the keypad 120 and the body 140. The PCB can be sized to fit at the bottom of the keypad and includes a central hole similar to the keypad. The screws from the keypad 120 can pass through the holes in the PCB 130 and fasten to the body 140. The PCB may include key input modules 132 that can be actuated by respective buttons of the keypad. Suitable indicator lights 134 can be also configured on the PCB. These indicator lights are visible through the lenses of the faceplate. The keypad can have cutouts to accommodate these indicator lights. The PCB may receive input from the respective buttons. Also, the PCB may include SMD or COB LEDs for illumination and indicator purposes. The PCB 130 may also contain the activation button electronics. The PCB may be connected to other systems, such as for receiving warnings and notifications from the system and sending signals through the buttons to the system.

Body 140 as shown in FIG. 2 can be cylindrical with a flanged plate at the top thereof. The PCB can be seated on the flanged plate, and holes in the flanged plate can receive the screws from the keypad, securing the same to the body. The body is also hollow at the center for receiving a light module 150 as explained below.

The hollow cylindrical body, also referred to herein as a shell can encase the light module 150. The light module, more clearly shown in FIG. 1, may have the reading light or any similar light. Such a light can be of higher intensity and may also form a beam. The light may be encased within a housing that is mounted within the shell. The light module includes customizable optical lens, and a knurled push surrounding surface for directional input, and the outer ring structure to support the tilting mechanism inside. Retainer pin 160 and ID label 170 for production information are encased with a final outer mounting compression ring body 180 to clamp the light to the ceiling or wall surface. The faceplate can fit over the final outer mounting compression ring body 180 using suitable mechanisms, such as snap fit mechanism or friction fit mechanism The device 100 may also include capacitive sense touch slide bars for the variation of intensity of light. The capacitive sense touch slide bars can be programmable to touch sensitivity. The device 100 may also include a local or remote power button control and active call button with remote signal.

Figure 4:
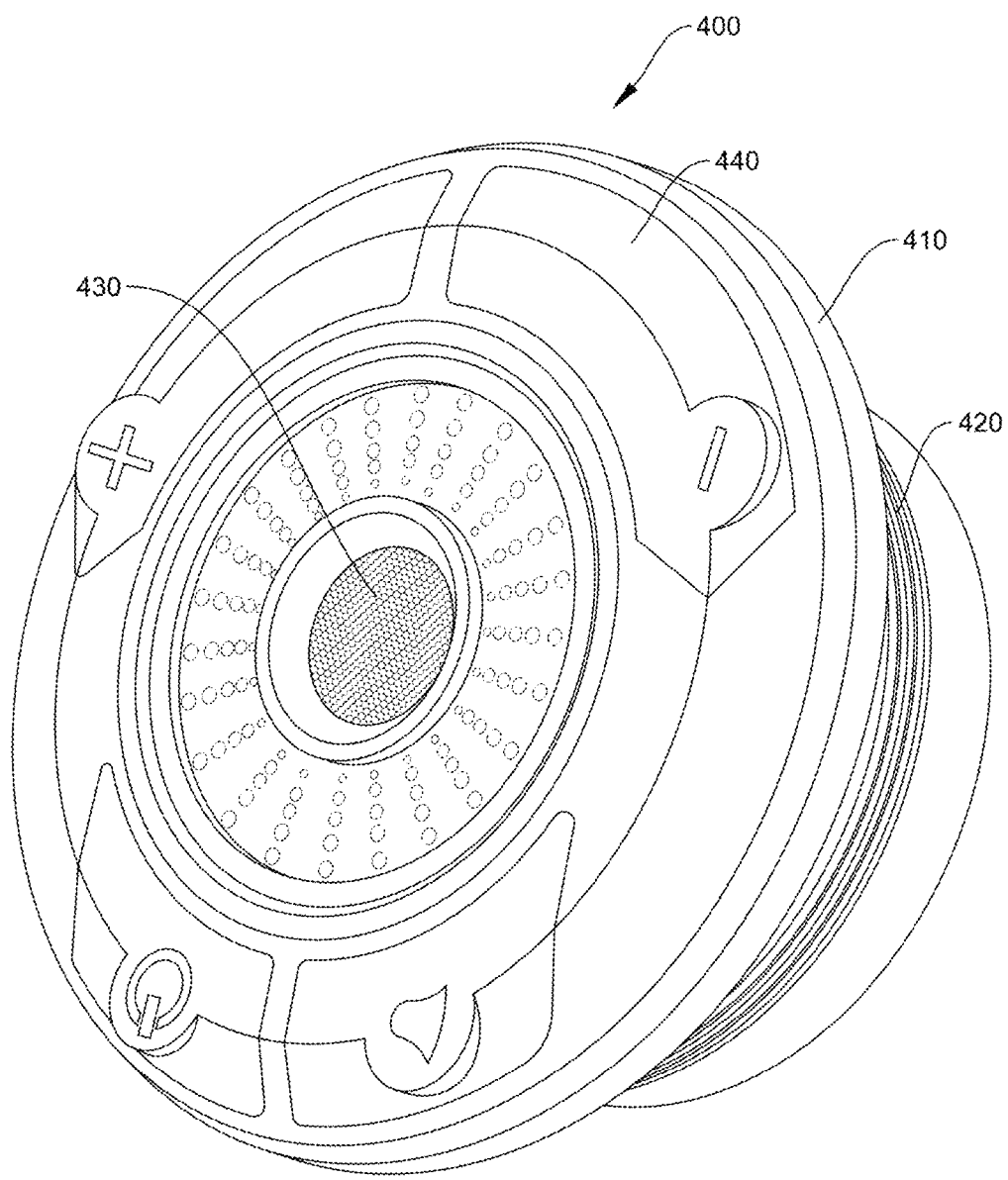
FIG. 4 is a perspective view of the multipurpose overhead ceiling device showing signs, according to an exemplary embodiment of the present invention.

FIG. 4 shows another implementation of the device in which the faceplate and the location of buttons are changed. FIG. 4 shows the overhead ceiling device 400 having a faceplate 410, a body 420, and a light module 430. Buttons 440 protrudes from cutouts in the faceplate.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above-described embodiment, method, and examples, but by all embodiments and methods within the scope and spirit of the invention as claimed.

What is claimed is:

1. An overhead ceiling device for vehicles, the overhead ceiling device comprises:
   a faceplate of a round shape and having a central hole, the faceplate comprises lenses for lights and holes for buttons;
   a keypad having a central hole corresponding to the faceplate and configured to mount at a bottom of the faceplate, the keypad comprises a plurality of buttons configured to protrude from the holes in the faceplate;
   a printed circuit board (PCB) of a shape corresponding to the keypad, wherein the keypad is seated over the PCB and sandwiched between the faceplate and the PCB, the PCB comprising a plurality of key input modules for the plurality of buttons, and one or more indicator lights;
   a body having a cylindrical hollow profile and a flanged plate at a top of the hollow cylindrical profile, wherein the PCB is seated over the flanged plate;
   a light module configured to encase within the body; and
   an outer mounting compression ring body, wherein the body is configured to be seated over the outer mounting compression ring body and the faceplate is configured to fit over the outer mounting compression ring body.

2. The overhead ceiling device of claim 1, wherein icons are printed on the plurality of buttons, wherein each icon corresponds to a function of the respective button.

3. The overhead ceiling device of claim 2, wherein the light module comprises a reading light encased within a housing.

4. The overhead ceiling device of claim 1, wherein the light module comprises a reading light encased within a housing.

5. The overhead ceiling device of claim 4, wherein the reading light and a top of the housing are accessible from the central hole of the faceplate.

6. The overhead ceiling device of claim 5, wherein the housing is configured to tilt, causing the reading light to tilt.

* * * * *